United States Patent
Tseng et al.

(10) Patent No.: US 12,159,671 B2
(45) Date of Patent: Dec. 3, 2024

(54) IN-DYNAMIC MEMORY SEARCH DEVICE AND OPERATION METHOD THEREOF

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Yu-Hsuan Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 159 days.

(21) Appl. No.: 18/164,657

(22) Filed: Feb. 6, 2023

(65) Prior Publication Data

US 2024/0265966 A1    Aug. 8, 2024

(51) Int. Cl.
 *G11C 15/04* (2006.01)
(52) U.S. Cl.
 CPC .................................. *G11C 15/04* (2013.01)
(58) Field of Classification Search
 CPC .............................. G11C 15/04; G11C 15/046
 See application file for complete search history.

(56) References Cited

U.S. PATENT DOCUMENTS

| | | | |
|---|---|---|---|
| 6,944,038 B2 | 9/2005 | De Sandre | |
| 7,057,912 B2 | 6/2006 | Hanzawa | |
| 7,319,608 B2 | 1/2008 | Hsu | |
| RE41,351 E | 5/2010 | Lien | |
| 10,847,224 B1* | 11/2020 | Li | G11C 13/004 |
| 2004/0240277 A1* | 12/2004 | Hanzawa | G11C 15/043 365/189.07 |
| 2018/0040374 A1* | 2/2018 | Zheng | G11C 15/046 |
| 2018/0102365 A1* | 4/2018 | Van Houdt | G11C 11/405 |
| 2021/0375344 A1* | 12/2021 | Young | G11C 11/2275 |

FOREIGN PATENT DOCUMENTS

TW     I763266 B     5/2022

OTHER PUBLICATIONS

Belmonte, et al.: "Tailoring IGZO-TFT architecture for capacitor-less DRAM, demonstrating > 103s retention, >1011 cycles endurance and Lg scalability down to 14nm"; 978-1-6654-2572-8/21/$31.00 © 2021 IEEE; pp. 10.6.1-10.6.4.

* cited by examiner

*Primary Examiner* — Jerome Leboeuf
(74) *Attorney, Agent, or Firm* — McClure, Qualey & Rodack, LLP

(57) ABSTRACT

An in-dynamic memory search device and an operation method thereof are provided. The in-dynamic memory search device includes at least one word line, at least two bit lines, at least one match line, at least one unit cell, at least two search lines, at least one pre-charge unit and at least one sense unit. The unit cell includes two storage elements and two search transistors. Each of the storage elements includes a write transistor and a read transistor. The write transistor is connected to the word line and one of the bit lines. The read transistor is connected to the write transistor and the match line. The search transistors are respectively connected to the read transistors. The search lines are respectively connected to the search transistors. The pre-charge unit is connected to the match line. The sense unit is connected to the match line.

20 Claims, 15 Drawing Sheets

IN-DYNAMIC MEMORY SEARCH DEVICE AND OPERATION METHOD THEREOF

TECHNICAL FIELD

The disclosure relates in general to a memory device and an operation method thereof, and more particularly to an in-dynamic memory search device and an operation method thereof.

BACKGROUND

Conventional TCAMs based on static random-access memories (SRAMs) are used in commercial applications such as network routers. However, 16 transistors are required to form a single TCAM cell, which results in large areas and high power consumption, limiting its potential for energy-constrained applications.

TCAMs are used in routers, for database searches, for in-memory data processing, and for neuromorphic computing.

With the rise of IoT applications, the demand for low static power consumption CAMs is also increasing. Emerging Memory (RRAM, PCM, FeFET)-based TCAMs have been demonstrated enabling to overcome the challenges about area density/static power consumption without degrading performance. However, on/off ratio of ReRAM and PCM are not enough for many practical applications requiring the parallel search of massive datasets, because in a TCAM array, the leakage currents of the TCAM cells on the same match line add together, and the limited on/off ratio makes it difficult to distinguish between the all-match state and 1-bit-mismatch state when the array size is large. Moreover, the emerging memory based TCAM is with limited endurance and therefore constrained the data update frequency.

SUMMARY

The disclosure is directed to an in-dynamic memory search device and an operation method thereof. The in-dynamic memory search device which is a DRAM-like memory (paired 2T0C structure with 2 search transistors) based TCAM structure is provided for in-memory search function. The in-dynamic memory search device can provide un-limited data update frequency, fast search latency, and large on/off ratio for long search word. The unit cell of the in-dynamic memory search device is a 6TOC structure for small chip areas as compared with SRAM based TCAM chip. It can be used for routers application, database search, in-memory data processing, and neuromorphic computing.

According to one embodiment, an in-dynamic memory search device is provided. The in-dynamic memory search device includes at least one word line, at least two bit lines, at least one match line, at least one unit cell, at least two search lines, at least one pre-charge unit and at least one sense unit. The unit cell includes two storage elements and two search transistors. Each of the storage elements includes a write transistor and a read transistor. The write transistor is connected to the word line and one of the bit lines. The read transistor is connected to the write transistor and the match line. The search transistors are respectively connected to the read transistors. The search lines are respectively connected to the search transistors. The pre-charge unit is connected to the match line. The sense unit is connected to the match line.

According to another embodiment, an operation method of an in-dynamic memory search device is provided. The in-dynamic memory search device includes at least one word line, at least two bit lines, at least one match line, at least one unit cell and two search transistors. The unit cell includes two storage elements and two search transistors. Each of the storage elements includes a write transistor connected to the word line and one of the bit lines and a read transistor connected to the write transistor and the match line. The operation method includes the flowing steps. A storage data is written in the unit cell. The match line is pre-charged. A search input is inputted to the search lines. A voltage of the match line is sensed to determine whether the search input and the storage data are matched or not.

Figure 1:
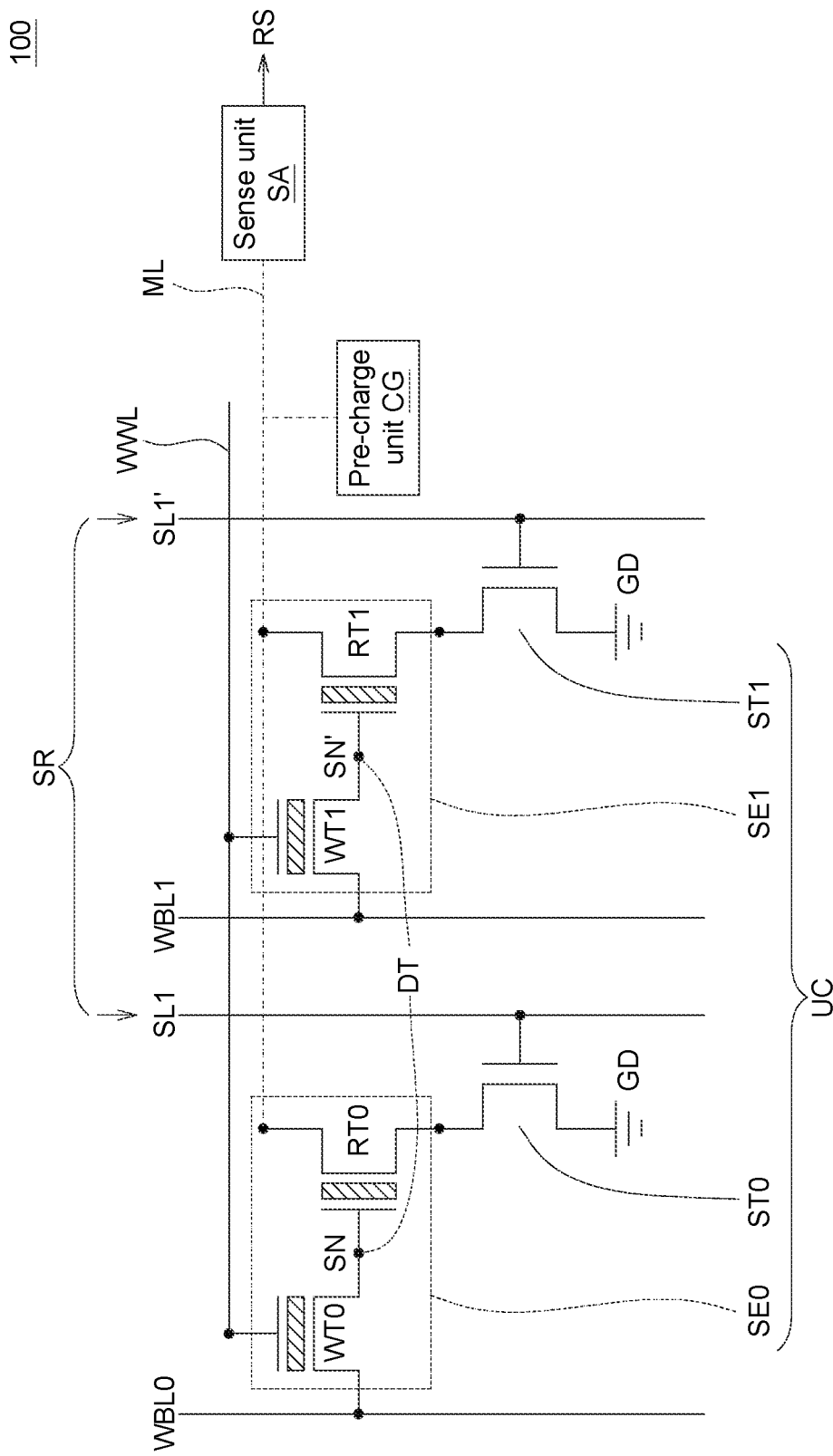
FIG. 1 shows an in-dynamic memory search device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows an in-dynamic memory search device 100 according to one embodiment. The in-dynamic memory search device 100 is a DRAM-like memory based TCAM structure for in-memory search function. For example, the in-dynamic memory search device 100 is a 2D flash device or a 3D flash device. As shown in FIG. 1, one unit cell UC of the in-dynamic memory search device 100 is used to store one bit of a storage data DT. A search input SR is inputted into the in-dynamic memory search device 100, and a search result RS is outputted to indicate whether the storage data DT and search input SR are matched.

In the present disclosure, the in-dynamic memory search device 100 could provide un-limited data update frequency, fast search latency and large on/off ratio for long search word. The detail structure and the operation of the in-dynamic memory search device 100 is illustrated as below.

As shown in FIG. 1, the unit cell UC is a 6TOC structure with small area as compared with SRAM based TCAM structure. "6TOC" means six transistors and zero capacitor. In this embodiment, the 6TOC structure includes one paired storage elements SE0, SE1 and two search transistors ST0, ST1. Each of the storage elements SE0, SE1 is a 2T0C structure. "2T0C" means two transistors and zero capacitor.

In particular, the storage element SE0 includes a write transistor WT0 and a read transistor RT0; the storage element SE1 includes a write transistor WT1 and a read transistor RT1.

In detail, the in-dynamic memory search device 100 includes at least one word line WWL, at least two bit lines WBL0, WBL1, at least one match line ML, the at least one unit cell UC, at least two search lines SL1, SL1', at least one pre-charge unit CG and at least one sense unit SA. A gate of the write transistor WT0 is connected to the word line WWL, a source/drain of the write transistor WT0 is connected to the bit line WBL0, another source/drain of the write transistor WT0 is connected to a gate of the read transistor RT0. The gate of the read transistor RT0 is connected to the source/drain of the write transistor WT0, a source/drain of the read transistor RT0 is connected to the match line ML, and another source/drain of the read transistor RT0 is connected to a source/drain of the search transistor ST0. A gate of the search transistor ST0 is connected to the search line SL1, the source/drain of the search transistor ST0 is connected to the source/drain of the read transistor RT0, and another source/drain of the search transistor ST0 is connected to a ground end GD. The read transistor RT0 and the search transistor ST0 are connected in series and connected between the match line ML and the ground end GD.

A gate of the write transistor WT1 is connected to the word line WWL, a source/drain of the write transistor WT1 is connected to the bit line WBL1, another source/drain of the write transistor WT1 is connected to a gate of the read transistor RT1. The gate of the read transistor RT1 is connected to the source/drain of the write transistor WT1, a source/drain of the read transistor RT1 is connected to the match line ML, and another source/drain of the read transistor RT1 is connected to a source/drain of the search transistor ST1. A gate of the search transistor ST1 is connected to the search line SL1', the source/drain of the search transistor ST1 is connected to the source/drain of the read transistor RT1, and another source/drain of the search transistor ST1 is connected to a ground end GD. The read transistor RT1 and the search transistor ST1 are connected in series and connected between the match line ML and the ground end GD.

The pre-charge unit CG is connected to the match line ML for pre-charging the match line ML to a predetermined voltage level. The sense unit SA is connected to the match line ML for sensing a voltage level of the match line ML.

Please referring to table I and FIGS. 2A to 2D. Table I shows the voltages applied to the in-dynamic memory search device 100 when writing the storage data DT. FIGS. 2A to 2D illustrate the operation in the table I. In the first row of the table I, the storage data DT to be stored in the unit cell UC is "0." In the second row of the table, the storage data DT to be stored in the unit cell UC is "1." In the third row of the table I, the storage data DT to be stored in the unit cell UC is "Don't care." "Don't care" could match to any search input SR. In the fourth row of the table I, the storage data DT to be stored in the unit cell UC is "Invalid." "Invalid" could not match to any search input SR.

TABLE I

| Storage data DT | Word line WWL | Bit line WBL0 | Bit line WBL1 | Search line SL1 | Search line SL1' | Match line ML |
|---|---|---|---|---|---|---|
| 0 | 3 V | 0 V | 1 V | 0 V | 0 V | 0 V |
| 1 | 3 V | 1 V | 0 V | 0 V | 0 V | 0 V |
| Don't care | 3 V | 0 V | 0 V | 0 V | 0 V | 0 V |
| Invalid | 3 V | 1 V | 1 V | 0 V | 0 V | 0 V |

Figure 2A:
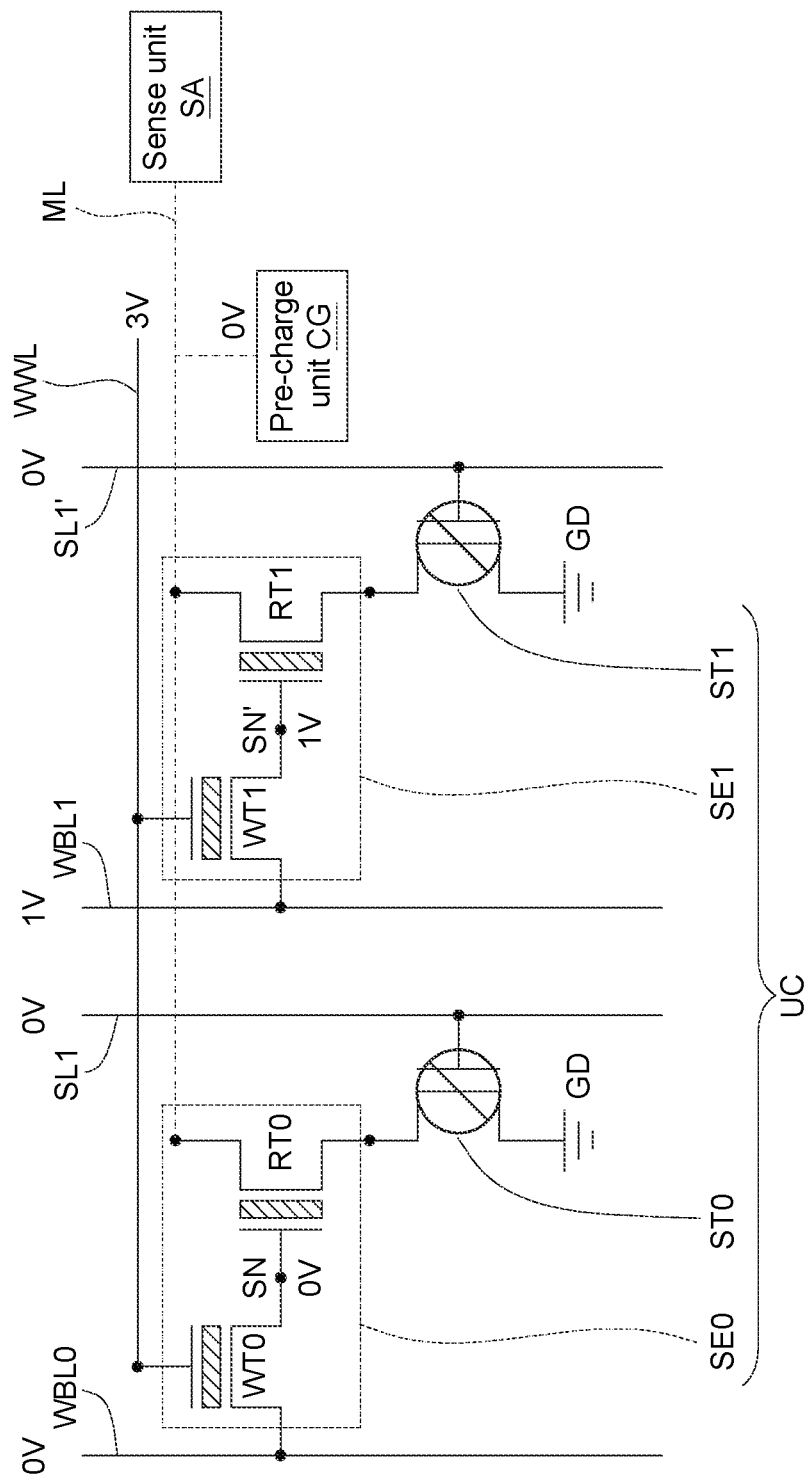
FIGS. 2A to 2D illustrate the operation in a table I.

As shown in FIG. 2A and the first row in the table I, "0" is stored into the unit cell UC. The word line WWL is applied a turning-on voltage, such as 3V, to turn on the write transistors WT0, WT1. The search lines SL1, SL1' are applied a turning-off voltage, such as 0V, to turn off the search transistors ST0, ST1. The bit line WBL0 is applied a predetermined low voltage, such as 0V, and the bit line WBL1 is applied a predetermined high voltage, such as 1V. "predetermined low voltage, predetermined high voltage" ("0V, 1V") represents "0" for the storage data DT. Because the write transistor WT0 is turned on, 0V applied from the bit line WBL0 is stored at a storage node SN between the write transistor WT0 and the read transistor RT0. Because the write transistor WT1 is turned on, 1V applied from the bit line WBL1 is stored at a storage node SN' between the write transistor WT1 and the read transistor RT1.

Figure 2B:
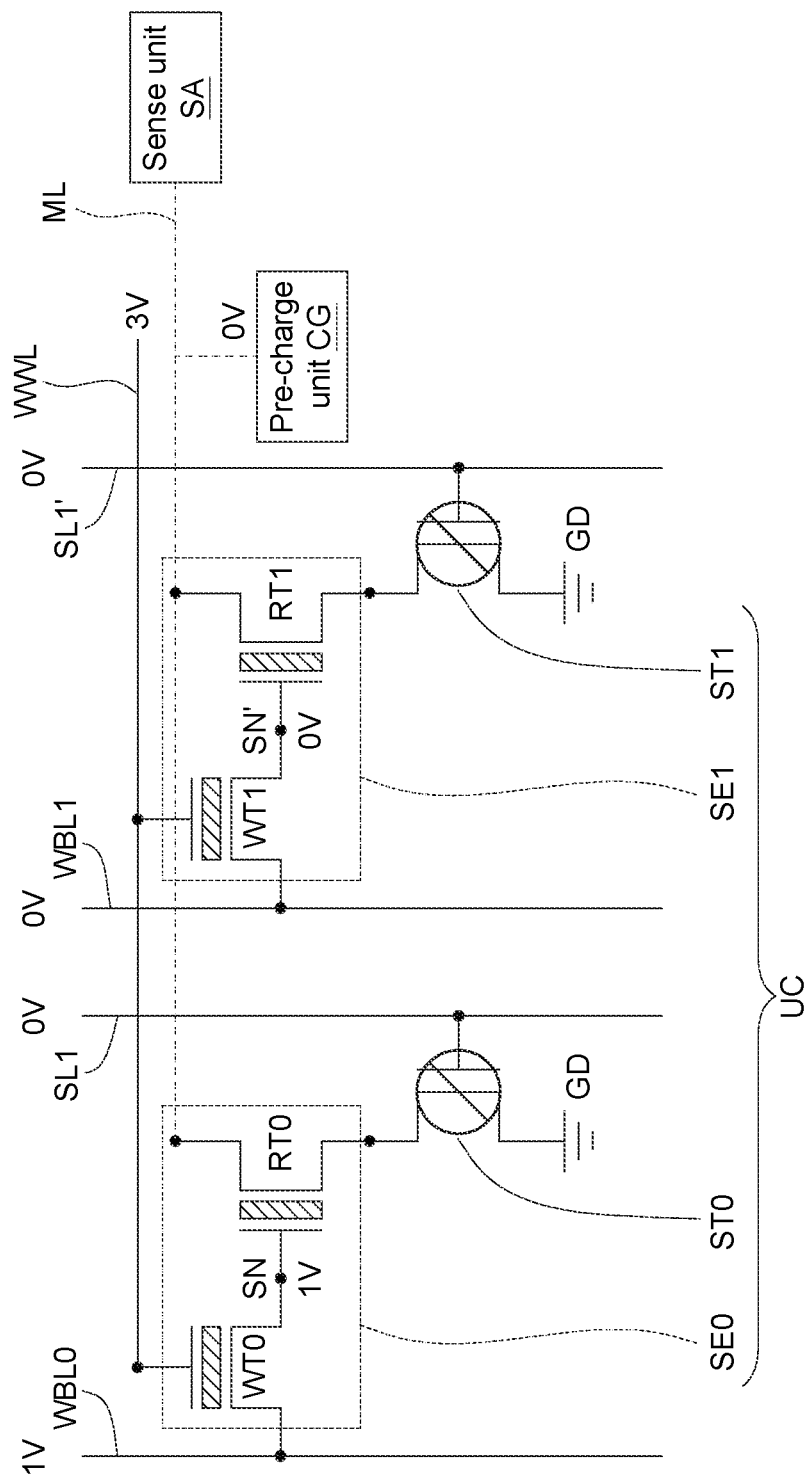

As shown in FIG. 2B and the second row in the table I, "1" is stored into the unit cell UC. The word line WWL is applied the turning-on voltage, such as 3V, to turn on the write transistors WT0, WT1. The search lines SL1, SL1' are applied the turning-off voltage, such as 0V, to turn off the search transistors ST0, ST1. The bit line WBL0 is applied the predetermined high voltage, such as 1V, and the bit line WBL1 is applied the predetermined low voltage, such as 0V. "predetermined high voltage, predetermined low voltage" ("1V, 0V") represents "1" for the storage data DT. Because the write transistor WT0 is turned on, 1V applied from the bit line WBL0 is stored at the storage node SN between the write transistor WT0 and the read transistor RT0. Because the write transistor WT1 is turned on, 0V applied from the bit line WBL1 is stored at the storage node SN' between the write transistor WT1 and the read transistor RT1.

Figure 2C:
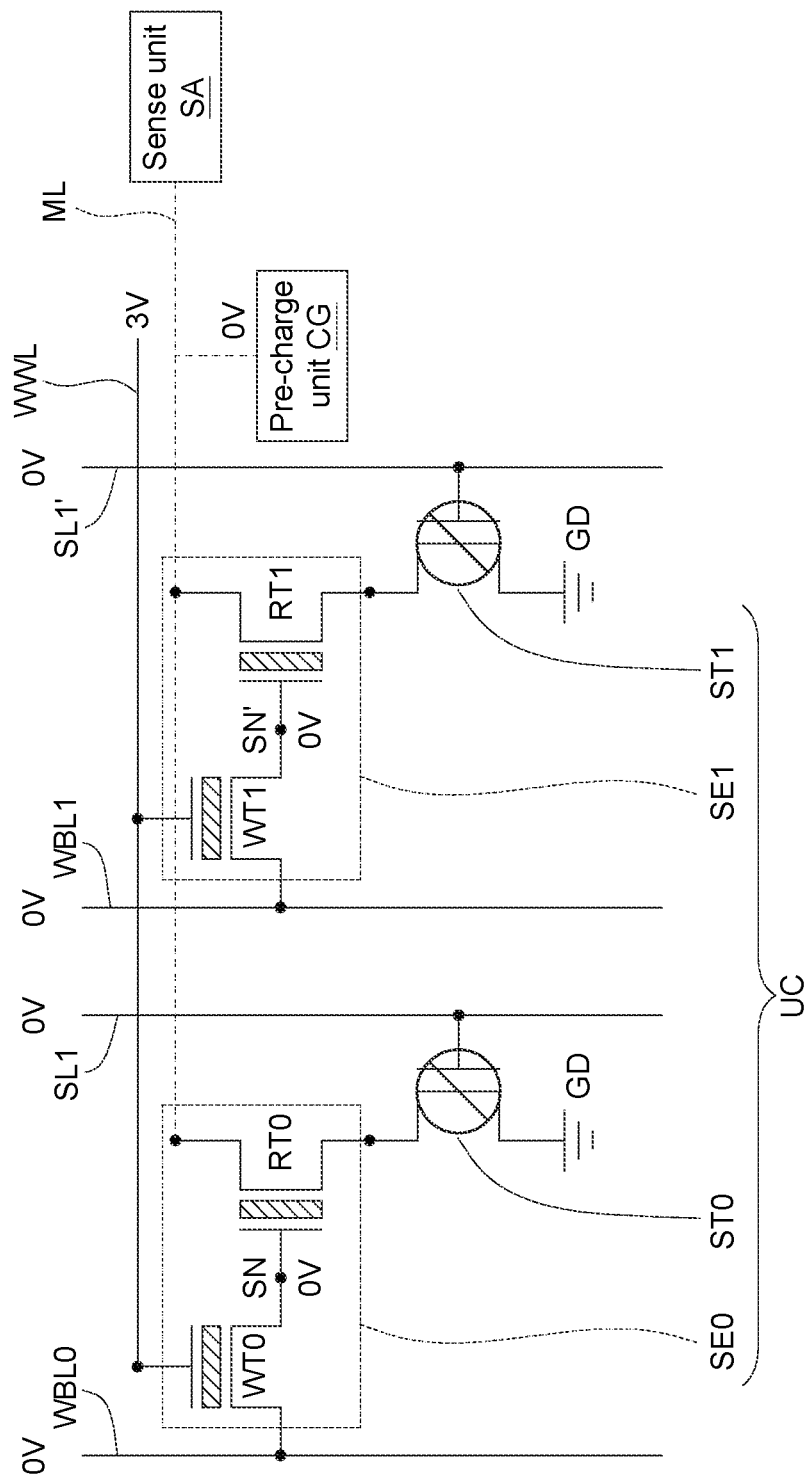

As shown in FIG. 2C and the third row in the table I, "Don't care" is stored into the unit cell UC. The word line WWL is applied the turning-on voltage, such as 3V, to turn on the write transistors WT0, WT1. The search lines SL1, SL1' are applied the turning-off voltage, such as 0V, to turn off the search transistors ST0, ST1. The bit line WBL0 is applied the predetermined low voltage, such as 0V, and the bit line WBL1 is applied the predetermined low voltage, such as 0V. "predetermined low voltage, predetermined low voltage" ("0V, 0V") represents "Don't care" for the storage data DT. Because the write transistor WT0 is turned on, 0V applied from the bit line WBL0 is stored at the storage node SN between the write transistor WT0 and the read transistor RT0. Because the write transistor WT1 is turned on, 0V applied from the bit line WBL1 is stored at the storage node SN' between the write transistor WT1 and the read transistor RT1.

Figure 2D:
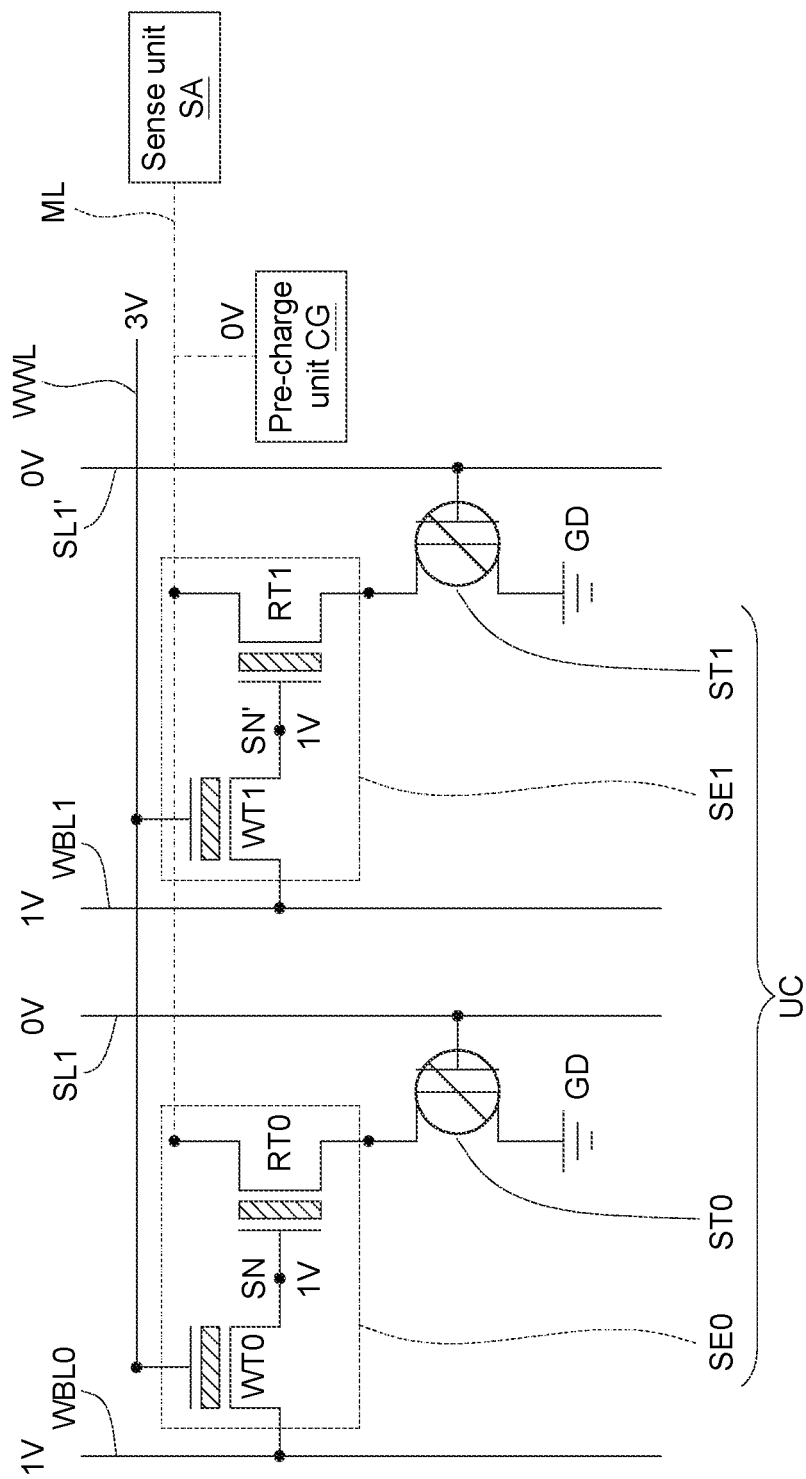

As shown in FIG. 2D and the fourth row in the table I, "Invalid" is stored into the unit cell UC. The word line WWL is applied the turning-on voltage, such as 3V, to turn on the write transistors WT0, WT1. The search lines SL1, SL1' are applied a turning-off voltage, such as 0V, to turn off the search transistors ST0, ST1. The bit line WBL0 is applied the predetermined high voltage, such as 1V, and the bit line WBL1 is applied the predetermined high voltage, such as 1V. "predetermined high voltage, predetermined high voltage" ("1V, 1V") represents "Invalid" for the storage data DT. Because the write transistor WT0 is turned on, 1V applied from the bit line WBL0 is stored at the storage node SN between the write transistor WT0 and the read transistor RT0. Because the write transistor WT1 is turned on, 1V applied from the bit line WBL1 is stored at the storage node SN' between the write transistor WT1 and the read transistor RT1.

Please referring to table II and FIGS. 3A to 3D. Table II shows the voltages applied to the in-dynamic memory search device 100 when searching the storage data DT. FIGS. 3A to 3D illustrate the operation in the table II. In the first row of the table II, the search input SR is "0." In the second row of the table, the search input SR is "1." In the third row of the table II, the search input SR is "Wildcard." "Wildcard" could match to any storage data DT. In the fourth row of the table II, the search input SR is "Invalid." "Invalid" could not match to any storage data DT.

TABLE II

| Search input DT | Word line WWL | Bit line WBL0 | Bit line WBL1 | Search line SL1 | Search line SL1' |
|---|---|---|---|---|---|
| 0 | 0 V (or −2 V) | 0 V | 0 V | 1 V | 0 V |
| 1 | 0 V (or −2 V) | 0 V | 0 V | 0 V | 1 V |
| Wildcard | 0 V (or −2 V) | 0 V | 0 V | 0 V | 0 V |
| Invalid | 0 V (or −2 V) | 0 V | 0 V | 1 V | 1 V |

Figure 3A:
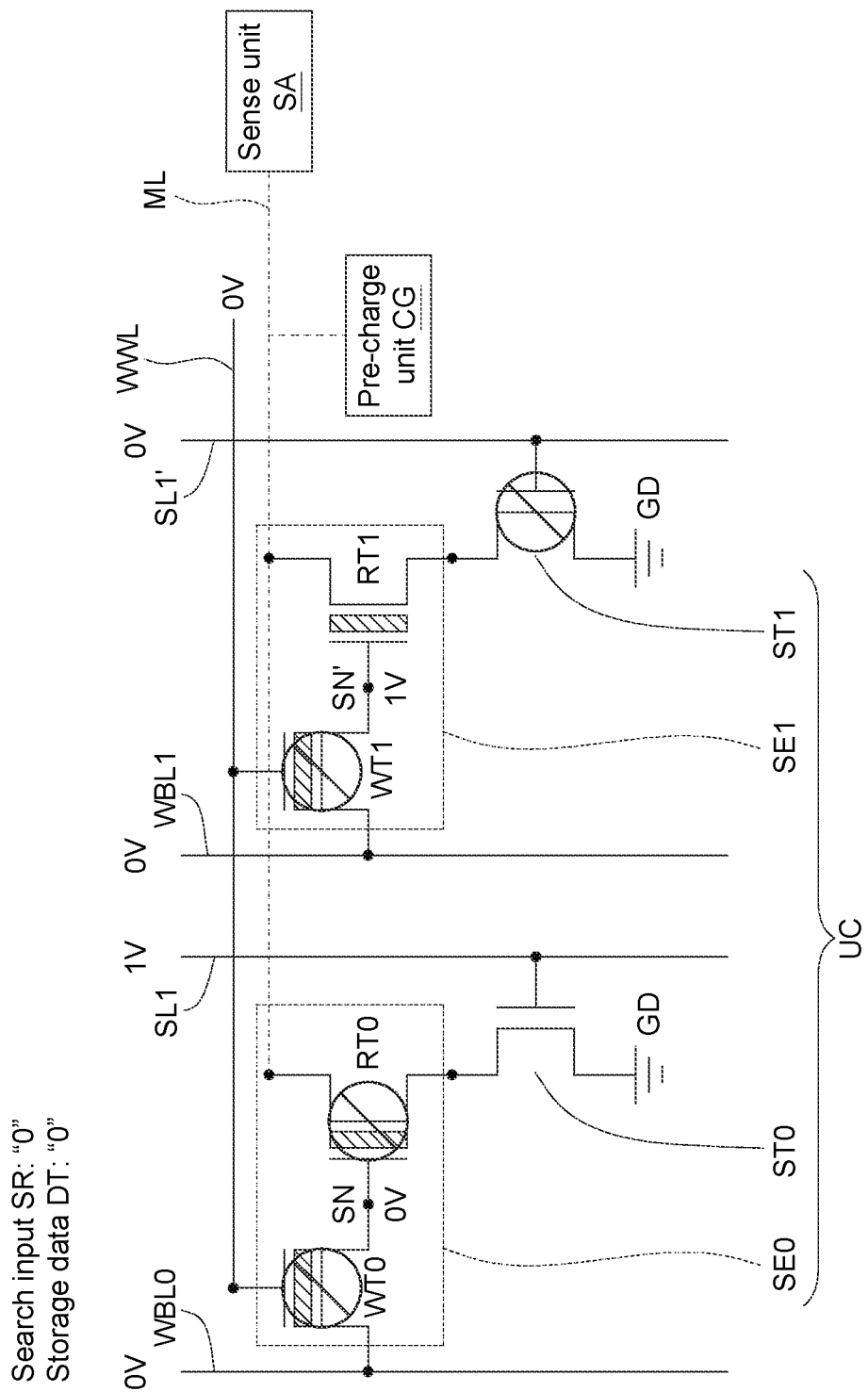
FIGS. 3A to 3D illustrate the operation in a table II.

As shown in FIG. 3A, the search input SR is "0", and the storage data DT is "0." 1V and 0V are respectively applied to the search lines SL1, SL1' and 0V and 1V are respectively stored at the storage nodes SN, SN'. The storage node SN is 0V and the read transistor RT0 is turned off accordingly, and 0V is applied to the search line SL1 and the search transistor ST1 is turned off accordingly, so the voltage of the match line ML would be kept.

Figure 3B:
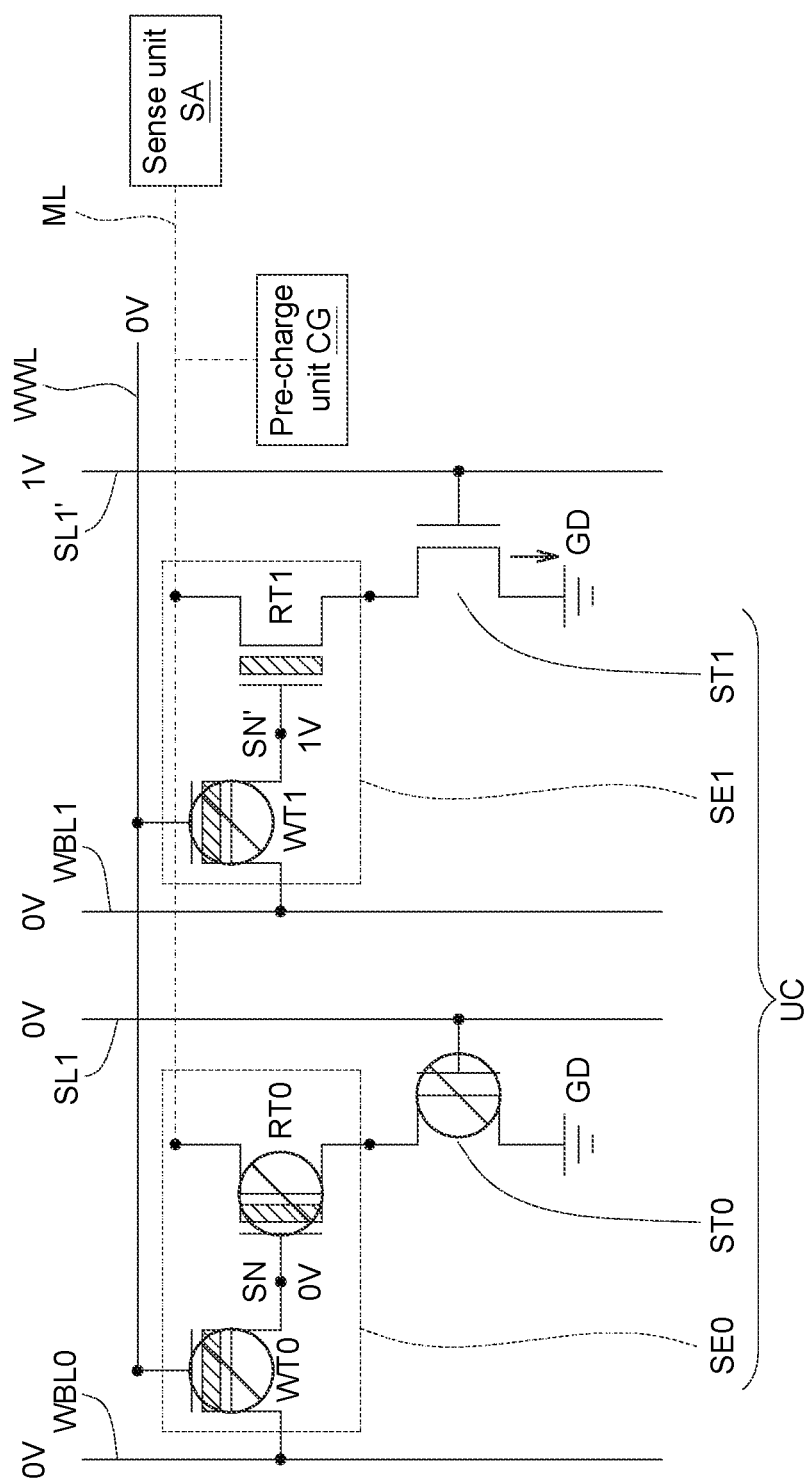

As shown in FIG. 3B, the search input SR is "1", and the storage data DT is "0." 0V and 1V are respectively applied to the search lines SL1, SL1' and 0V and 1V are respectively stored at the storage nodes SN, SN'. The storage node SN' is 1V and the read transistor RT1 is turned on accordingly, 1V is applied to the search line SL1 and the search transistor ST1 is turned on accordingly, so the voltage of the match line ML would be drop down.

Figure 3C:
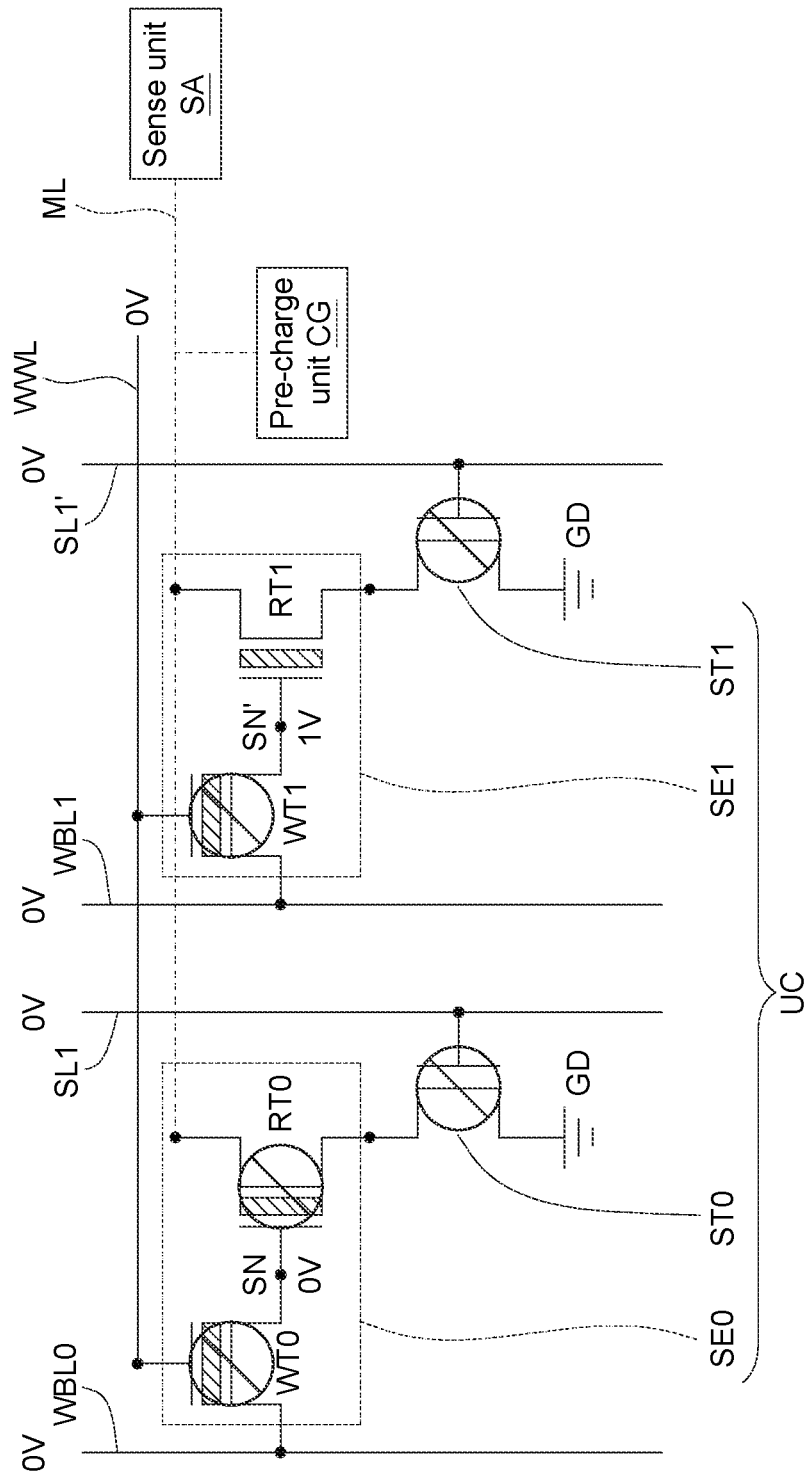

As shown in FIG. 3C, the search input SR is "Wildcard", and the storage data DT is "0." 0V and 0V are respectively applied to the search lines SL1, SL1' and 0V and 1V are respectively stored at the storage nodes SN, SN'. The storage node SN is 0V and the read transistor RT0 is turned off accordingly, 0V is applied to the search line SL1 and the search transistor ST1 is turned off accordingly, so the voltage of the match line ML would be kept.

Figure 3D:
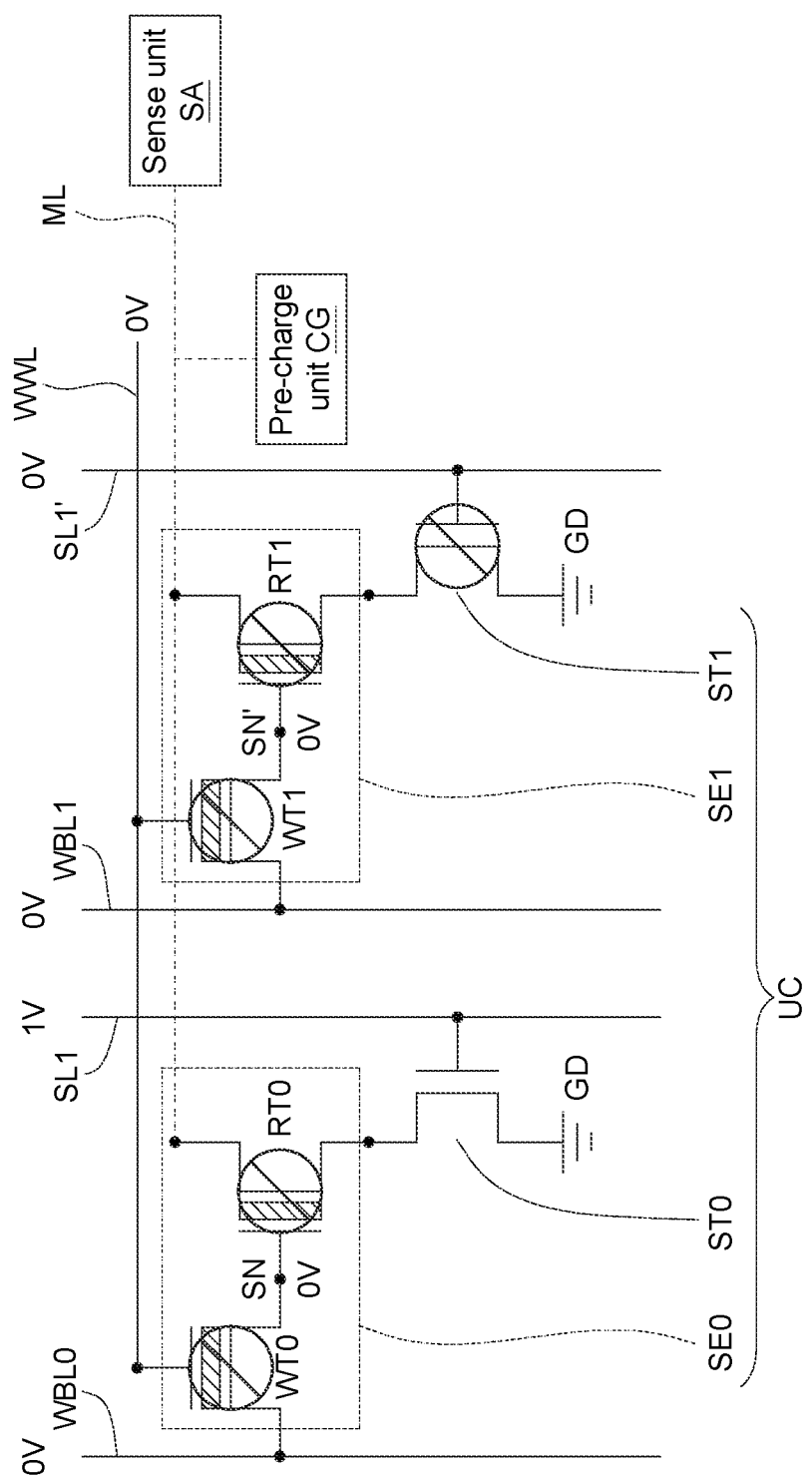

As shown in FIG. 3D, the search input SR is "0", and the storage data DT is "Don't care." 1V and 0V are respectively applied to the search lines SL1, SL1' and 0V and 0V are respectively stored at the storage nodes SN, SN'. The storage node SN is 0V and the read transistor RT0 is turned off accordingly, 0V is applied to the search line SL1 and the search transistor ST1 is turned off accordingly, so the voltage of the match line ML would be kept.

Some examples are illustrated as above. However, the operation of the in-dynamic memory search device 100 is not limited to those example. The operation of the in-dynamic memory search device 100 could be performed via the following flowing flowchart.

Figure 4:
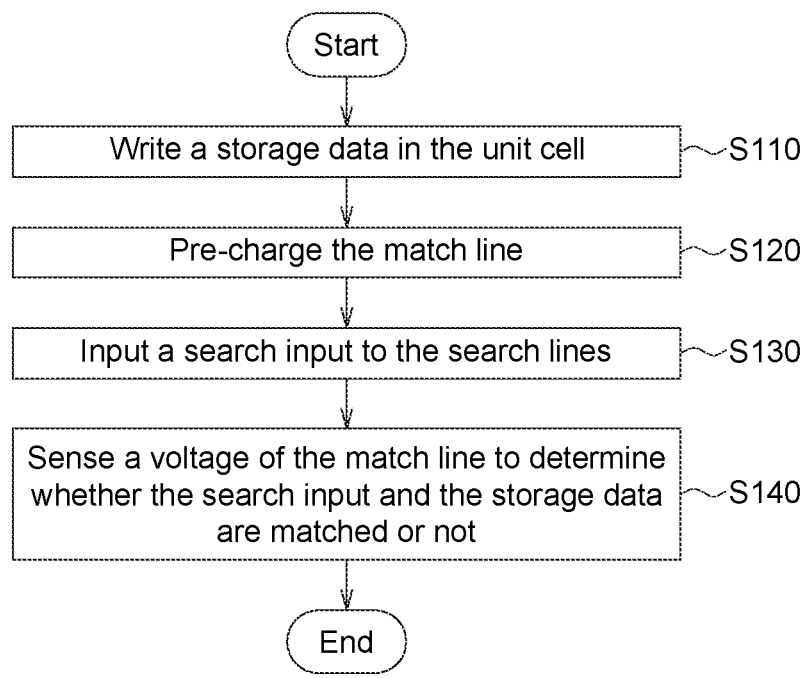
FIG. 4 shows a flowchart of an operation method of the in-dynamic memory search device.

Please refer to FIG. 4, which shows a flowchart of an operation method of the in-dynamic memory search device 100. The operation method includes steps S110 to S140. In the step S110, as shown in the examples of FIGS. 2A to 2D, the storage data ST is written in the unit cell UC. Please refer to FIG. 5A, which shows an I-V characteristic curve of the write transistor WT0 (or the write transistor WT1). In this step, the word line WWL is applied to the turning-on voltage Von, such as 3V, to turn on the write transistors WT0 and WT1. When the write transistors WT0, WT1 are turned on, the voltages applied from the bit lines WBL0, WBL1 could be stored at the storage nodes SN, SN'.

After the voltages are stored at the storage nodes SN, SN', the word line WWL is applied to the turning-off voltage Voff, such as 0V or −2V, to turn off the write transistors WT0 and WT1 for retaining the voltages at the storage nodes SN, SN'. In one embodiment, materials of the channel of the write transistors WT0, WT1 could be indium gallium zinc oxide (IGZO), poly-silicon, amorphous silicon (a-Si) or polycrystalline germanium (poly-Ge) to make the leakage currents lwk of the write transistors WT0, WT1 as low as possible. As the leakage currents lwk of the write transistors WT0, WT1 are low, the voltages stored at the storage nodes SN, SN' could be retained well.

Then, in the step S120, as shown in the examples of FIG. 3A to 3D, the match line ML is pre-charged by the pre-charge unit CG. For example, the match line ML could be pre-charged to a preset voltage, such as 5V.

Next, in the step S130, as shown in the examples of FIG. 3A to 3D, the search input SR is inputted to the search lines SL1, SL1'. In this step, if the voltage stored at the storage node SN is 1V, the read transistor RT0 is turned on; if the voltage stored at the storage node SN' is 1V, the read transistor RT1 is turned on; if the voltage applied to the search line SL1 is 1V, the search transistor ST0 is turned on; if the voltage applied to the search line SL1' is 1V, the search transistor ST1 is turned on.

Figure 5A:
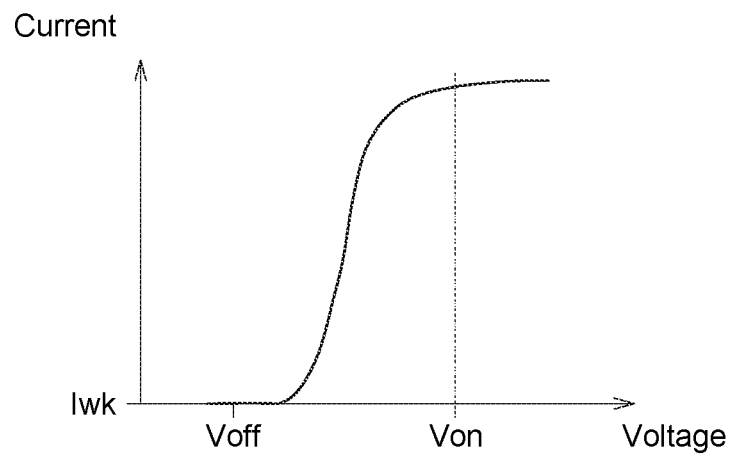
FIG. 5A shows an I-V characteristic curve of a write transistor.
Figure 5B:
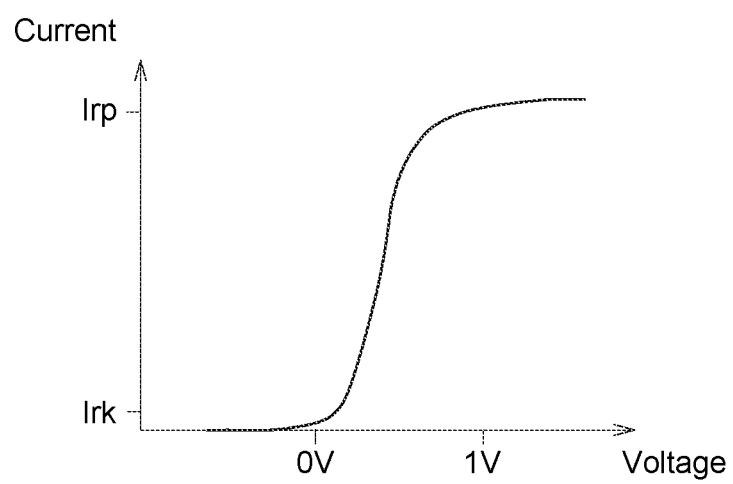
FIG. 5B shows an I-V characteristic curve of a read transistor.

Please refer to FIG. 5B, which shows an I-V characteristic curve of the read transistor RT0 (or the read transistor RT1). In one embodiment, materials of the channel of the read transistors RT0, RT1 could be single crystal silicon, single crystal germanium (single crystal Ge), III-V material, indium gallium zinc oxide (IGZO) to make the pass currents Irp of the read transistors RT0, RT1 as high as possible. As the pass currents Irp of the read transistors RT0, RT1 are high, the voltage drop on the match line ML could be obvious and the search speed could be increased.

As shown in FIG. 5B, the pass current Irp is about $1*10^{-6}$ A, and the leakage current Irk is about $1*10^{-12}$ A. The on/off ratio of the read transistors RT0, RT1 is quite large (about 10-6), such that it is possible used for long word searching.

Afterwards, in step S140, the voltage of the match line ML is sensed by the sense unit SA to determine whether the search input SR and the storage data DT are matched or not.

Figure 6A:
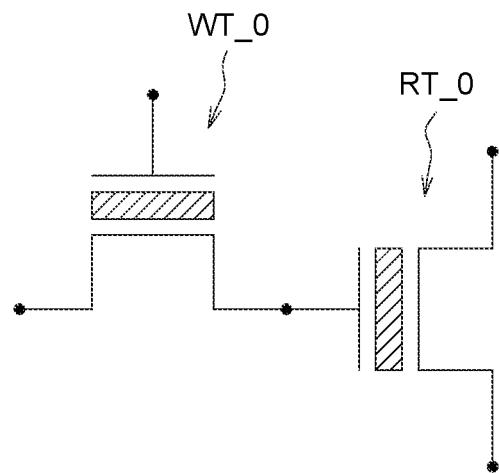
FIGS. 6A to 6D show four kinds of 2T0C structures.

Each of the storage elements SE0, SE1 is a 2T0C structure. In some embodiments, the 2T0C structure can be realized by the following four kinds of structures. Please refer to FIGS. 6A to 6D, which show four kinds of 2T0C structures. As shown in FIG. 6A, the storage element SE_0 includes a write transistor WT_0 and a read transistor RT_0. In the storage element SE_0, both of the write transistor WT_0 and the read transistor RT_0 are threshold voltage tunable transistors. For example, the write transistor WT_0 has a charge storage layer or a ferroelectric layer in its gate stack and the read transistor RT_0 has a charge storage layer or a ferroelectric layer in its gate stack. The charge storage layer or the ferroelectric layer is indicated by slashes. For example, the charge storage layer could be a SONOS structure or a floating gate, and the ferroelectric layer could be FeFET structure.

Figure 6B:
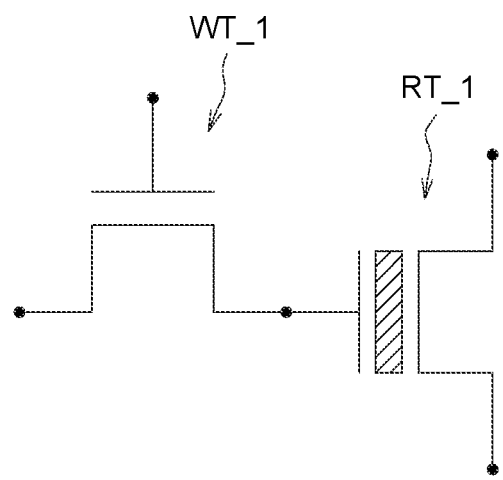

As shown in FIG. 6B, the storage element SE_1 includes a write transistor WT_1 and a read transistor RT_1. In the storage element SE_1, only the read transistor RT_1 is a threshold voltage tunable transistor. For example, the write transistor WT_1 does not have any charge storage layer or any ferroelectric layer in its gate stack, and the read transistor RT_1 has a charge storage layer or a ferroelectric layer in its gate stack. The charge storage layer or the ferroelectric layer is indicated by slashes. For example, the charge storage layer could be a SONOS structure or a floating gate, and the ferroelectric layer could be FeFET structure.

Figure 6C:
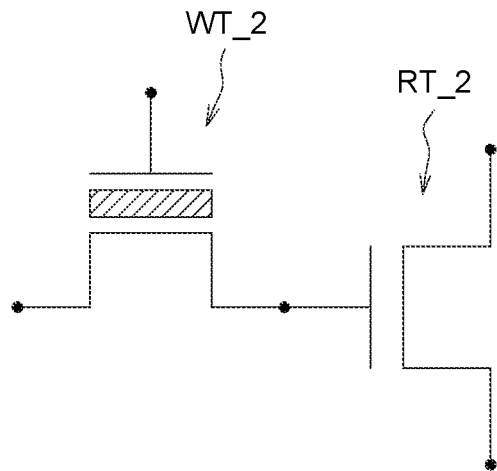

As shown in FIG. 6C, the storage element SE_2 includes a write transistor WT_2 and a read transistor RT_2. In the storage element SE_2, only the write transistor WT_2 is a threshold voltage tunable transistor. For example, the write transistor WT_2 has a charge storage layer or a ferroelectric layer in its gate stack, and the read transistor RT_2 does not have any charge storage layer or any ferroelectric layer in its gate stack. The charge storage layer or the ferroelectric layer is indicated by slashes. For example, the charge storage layer could be a SONOS structure or a floating gate, and the ferroelectric layer could be FeFET structure.

Figure 6D:
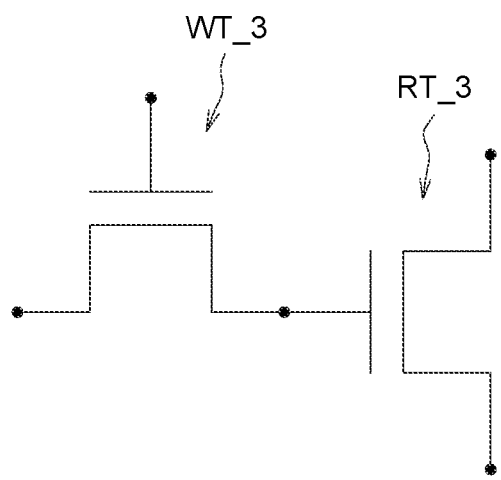

As shown in FIG. 6D, the storage element SE_3 includes a write transistor WT_3 and a read transistor RT_3. In the storage element SE_3, both of the write transistor WT_3 and the read transistor RT_3 are not threshold voltage tunable transistors.

Based on the 2T0C structures realized by threshold voltage tunable transistor(s), the leakage currents and the pass current is tunable and several advantages could be obtained accordingly. For example, as shown in FIG. 5A, if the leakage currents Iwk of the write transistors WT0, WT1 are tuned to be low, the voltages stored at the storage nodes SN, SN' could be retained well. Moreover, as shown in FIG. 5B, if the pass currents of the read transistors RT0, RT1 are tuned to be high, the voltage drop on the match line ML could be obvious and the search speed could be increased. If the on/off ratio of the read transistors RT0, RT1 is tuned to be large, it is possible used for long word searching.

Moreover, in the storage elements SE0, SE1, the storage data DT is stored through voltages at the storage nodes SN, SN', so the in-dynamic memory search device could provide un-limited update frequency.

Figure 7:
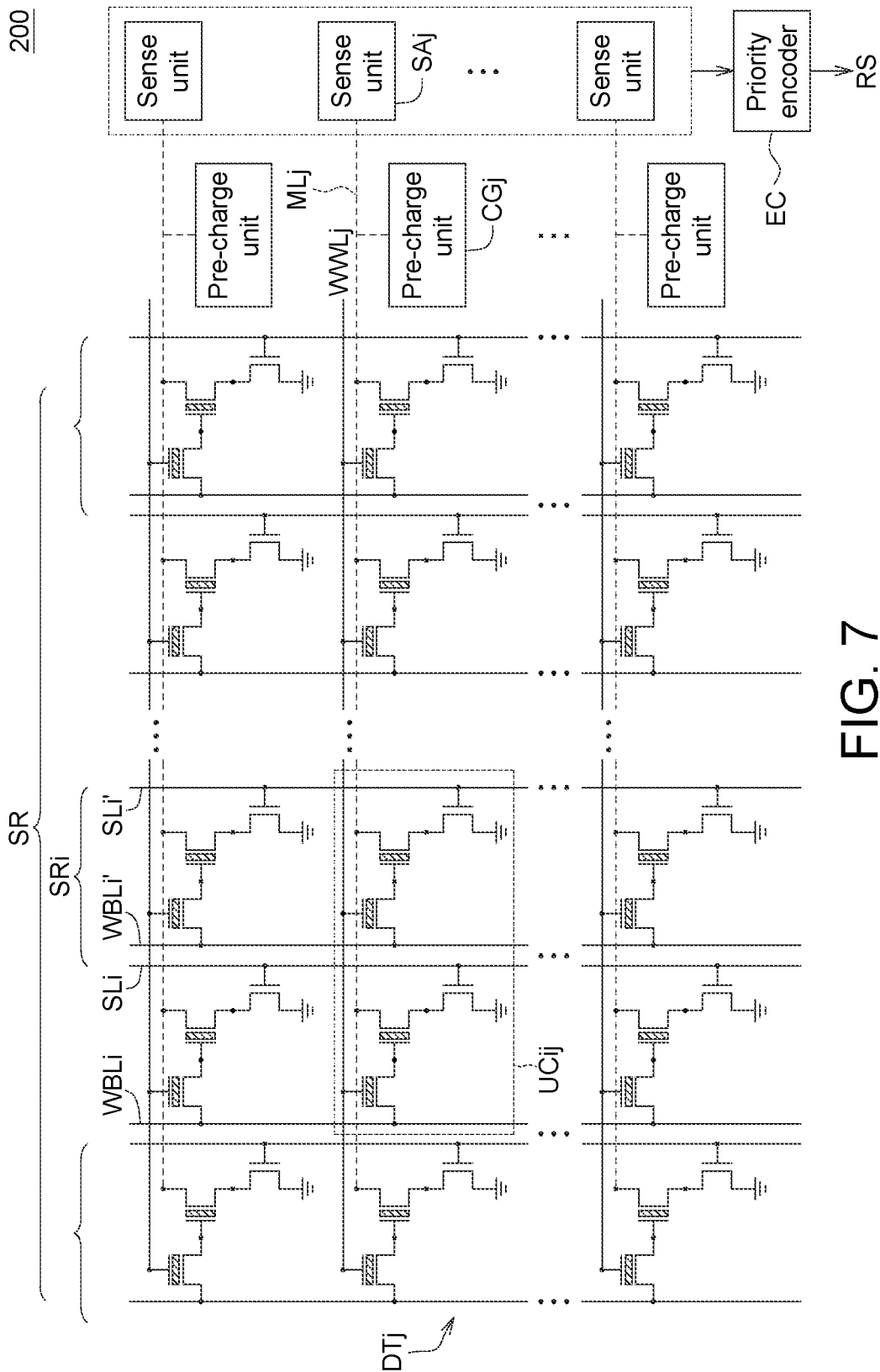
FIG. 7 shows an in-dynamic memory search device according to embodiment.
Figure 8:
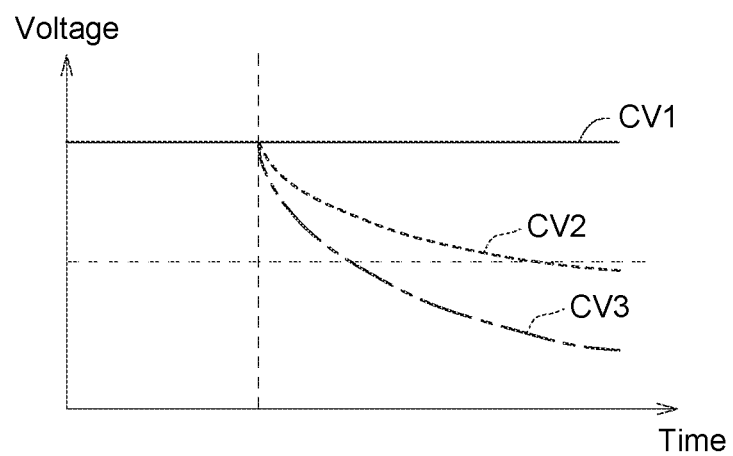
FIG. 8 shows a plurality curves of a plurality of match lines.

Further, the in-dynamic memory search device 100 described above could be implemented as an array structure to search a long length word. Please refer to FIG. 7 which shows an in-dynamic memory search device 200 according to one embodiment. The in-dynamic memory search device 200 includes a plurality of word lines WWLj, a plurality of bit lines WBLi, WBLi', a plurality of match lines MLj, a plurality of unit cells UCij, a plurality of search lines SLi, SLi', a plurality of pre-charge units CGj, a plurality of sense units SAj, and a priority encoder EC. The search input SR includes a plurality bits SRi. The search input SR is inputted into the in-dynamic memory search device 200, and the voltages of the match lines MLj are detected by the sense units SAj to indicate whether the storage data DTj are matched the search input SR or not. Please referring to FIG. 8, which shows a plurality exemplified curves CV1, CV2, CV3 of the match line MLj. When all bits of the storage data DTj are matched with all bits of the search input SR, the voltage of the curve CV1 is kept without voltage dropping.

When one bit of the storage data DTj is not matched with the corresponding bit of the search input SR, the voltage of the curve CV2 is slightly dropped.

When two bits of the storage data DTj is not matched with the corresponding bits of the search input SR, the voltage of the curve CV3 is more dropped.

The priority encoder EC outputs the search result RS according to the voltage drop amount. In the search result RS, the storage data DTj might be ranked according to degree of matching.

According to the embodiments described above, the in-dynamic memory search device which is a DRAM-like memory based TCAM structure is provided for in-memory search function. The in-dynamic memory search device can provide un-limited data update frequency, fast search latency, and large on/off ratio for long search word. The unit cell of the in-dynamic memory search device is the 6T0C structure for small chip areas as compared with SRAM based TCAM chip. It can be used for routers application, database search, in-memory data processing, and neuromorphic computing.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An in-dynamic memory search device, comprising:
    at least one word line;
    at least two bit lines;
    at least one match line;
    at least one unit cell, comprising:
        two storage elements, each of which including:
            a write transistor, connected to the word line and one of the bit lines; and
            a read transistor, connected to the write transistor and the match line; and
        two search transistors, respectively connected to the read transistors;
    at least two search lines, respectively connected to the search transistors;
    at least one pre-charge unit, connected to the match line; and
    at least one sense unit, connected to the match line.

2. The in-dynamic memory search device according to claim 1, wherein each of the storage elements includes a storage node located between the write transistor and the read transistor, and the unit cell stores one bit of a storage data in the storage nodes.

3. The in-dynamic memory search device according to claim 2, wherein the storage data is written into the storage nodes by turning on the write transistors.

4. The in-dynamic memory search device according to claim 1, wherein a material of a channel of each of the write transistors is indium gallium zinc oxide (IGZO), polysilicon, amorphous silicon (a-Si) or polycrystalline germanium (poly-Ge).

5. The in-dynamic memory search device according to claim 1, wherein a material of a channel of each of the read transistors is single crystal silicon, single crystal germanium (single crystal Ge), III-V material, indium gallium zinc oxide (IGZO).

6. The in-dynamic memory search device according to claim 1, wherein in each of the storage elements, both of the write transistor and the read transistor are threshold voltage tunable transistors.

7. The in-dynamic memory search device according to claim 1, wherein in each of the storage elements, one of the write transistor and the read transistor is a threshold voltage tunable transistor.

8. The in-dynamic memory search device according to claim 1, wherein in each of the storage elements, the write transistor or the read transistor has a charge storage layer or a ferroelectric layer.

9. The in-dynamic memory search device according to claim 8, wherein the charge storage layer is a SONOS structure or a floating gate.

10. The in-dynamic memory search device according to claim 8, wherein the ferroelectric layer is a FeFET structure.

11. The in-dynamic memory search device according to claim 1, wherein gates of the write transistors are connected to the word line.

12. The in-dynamic memory search device according to claim 1, wherein gates of the read transistors are respectively connected to the write transistors.

13. The in-dynamic memory search device according to claim 1, wherein gates of the search transistors are respectively connected to the search lines.

14. The in-dynamic memory search device according to claim 1, wherein one of the read transistors and one of the search transistors are connected in series and connected between the match line and a ground end.

15. The in-dynamic memory search device according to claim 1, wherein the in-dynamic memory search device is a 2D flash device.

16. The in-dynamic memory search device according to claim 1, wherein the in-dynamic memory search device is a 3D flash device.

17. An operation method of an in-dynamic memory search device, wherein the in-dynamic memory search device includes at least one word line, at least two bit lines, at least one match line, at least one unit cell and two search transistors, the unit cell includes two storage elements and two search transistors, each of the storage elements includes a write transistor connected to the word line and one of the bit lines and a read transistor connected to the write transistor and the match line, and the operation method includes:
  writing a storage data in the unit cell;
  pre-charging the match line;
  inputting a search input to the search lines; and
  sensing a voltage of the match line to determine whether the search input and the storage data are matched or not.

18. The operation method of the in-dynamic memory search device according to claim 17, wherein each of the storage elements includes a storage node located between the write transistor and the read transistor, and in the step of writing the storage data in the unit cell, one bit of the storage data is stored in the storage nodes.

19. The operation method of the in-dynamic memory search device according to claim 17, wherein in the step of writing the storage data in the unit cell, the one bit of the storage data is written into the storage nodes by turning on the write transistors.

20. The operation method of the in-dynamic memory search device according to claim 17, wherein in the step of sensing the voltage of the match line, the search input and the storage data are deemed as being matched when the voltage of the match line is kept.

* * * * *